United States Patent
Schaller et al.

(10) Patent No.: US 11,742,235 B2
(45) Date of Patent: Aug. 29, 2023

(54) COAXIAL LIFT DEVICE WITH DYNAMIC LEVELING

(71) Applicant: Applied Materials, Inc., Santa Clara, CA (US)

(72) Inventors: Jason M. Schaller, Austin, TX (US); Jeffrey Charles Blahnik, Volente, TX (US); Amit Kumar Bansal, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 795 days.

(21) Appl. No.: 16/565,287

(22) Filed: Sep. 9, 2019

(65) Prior Publication Data

US 2020/0105573 A1 Apr. 2, 2020

Related U.S. Application Data

(60) Provisional application No. 62/738,869, filed on Sep. 28, 2018.

(51) Int. Cl.
*H01L 21/687* (2006.01)
*H01J 37/32* (2006.01)

(52) U.S. Cl.
CPC .. *H01L 21/68764* (2013.01); *H01J 37/32715* (2013.01); *H01J 2237/002* (2013.01); *H01J 2237/20235* (2013.01)

(58) Field of Classification Search
CPC ........... H01J 37/32715; H01J 2237/002; H01J 2237/20235; H01L 21/68764

(Continued)

(56) References Cited

U.S. PATENT DOCUMENTS 5,791,895 A * 8/1998 Kyung ............. H01L 21/67115
118/503
10,249,525 B2  4/2019 Schaller et al.
(Continued)

FOREIGN PATENT DOCUMENTS

JP  3057094 B2  6/2000
JP  4255148 B2  4/2009
(Continued)

OTHER PUBLICATIONS

International Search Report dated Dec. 12, 2019 for Application No. PCT/US2019/048529.
(Continued)

*Primary Examiner* — Charlee J. C. Bennett
(74) *Attorney, Agent, or Firm* — Patterson + Sheridan, LLP

(57) ABSTRACT

Embodiments described herein generally relate to process chambers with coaxial lift devices. In some embodiments, the device comprises both a bottom bowl lift and a pedestal lift. The bottom bowl lift supports a bottom bowl and is configured to move the bottom bowl into a position that reduces the process volume. The bottom bowl lift is co-axial with the pedestal lift and the bottom bowl lift and the pedestal lift are attached for vacuum operation. The pedestal lift includes multiple actuators to create a dynamic lift mechanism. Both systems complete a nested system such that the bottom bowl lift is adjustable and can close the bottom bowl creating a symmetric and small process volume. The pedestal lift can move independently to its process position and tilt in a desired direction without interference with the bottom bowl lift, increasing film uniformity on a processed substrate.

17 Claims, 6 Drawing Sheets

(58) Field of Classification Search
USPC .......................................................... 118/729
See application file for complete search history.

(56) References Cited

U.S. PATENT DOCUMENTS

| | | | |
|---|---|---|---|
| 11,501,957 B2* | 11/2022 | Krishna | ............ H01L 21/68764 |
| 2003/0136520 A1 | 7/2003 | Yudovsky et al. | |
| 2003/0183611 A1 | 10/2003 | Gregor et al. | |
| 2005/0260345 A1 | 11/2005 | Lubomirsky et al. | |
| 2012/0244704 A1 | 9/2012 | Kao et al. | |
| 2014/0263275 A1 | 9/2014 | Nguyen et al. | |
| 2016/0189987 A1* | 6/2016 | Amikura | ........... H01L 21/67069 |
| | | | 156/345.29 |
| 2016/0315000 A1 | 10/2016 | Nguyen et al. | |
| 2016/0355927 A1* | 12/2016 | Weaver | ............. H01L 21/68785 |
| 2017/0191160 A1* | 7/2017 | Wiltse | ................ C23C 16/45589 |
| 2018/0096874 A1* | 4/2018 | Schaller | .............. C23C 16/4584 |
| 2018/0211820 A1 | 7/2018 | Krishna | ................... C23C 16/50 |
| 2022/0316066 A1* | 10/2022 | Santiago | ........... H01L 21/67259 |

FOREIGN PATENT DOCUMENTS

| | | |
|---|---|---|
| JP | 2017-122262 A | 7/2017 |
| KR | 10-2015-0034100 A | 4/2015 |
| WO | 2018-067297 A1 | 4/2018 |

OTHER PUBLICATIONS

TW Office Action dated Apr. 7, 2023 for Taiwan Application No. TW 108132371.
CN Office Action dated Jun. 3, 2023 for CN Application No. 201980057060.8.

* cited by examiner

COAXIAL LIFT DEVICE WITH DYNAMIC LEVELING

CROSS-REFERENCE TO RELATED APPLICATIONS

This application claims priority to U.S. Provisional Patent Application No. 62/738,869, filed Sep. 28, 2018, which is herein incorporated by reference in its entirety.

BACKGROUND

Field

Embodiments described herein generally relate to lift devices used to raise and lower a substrate supporting element used in a process chamber.

Description of the Related Art

Chemical vapor deposition (CVD) is generally employed to deposit a film on a substrate in a semiconductor process chamber, such as a semiconductor wafer or transparent substrate used for flat panel displays. CVD is generally accomplished by introducing process gases into a vacuum chamber that contains a substrate. The precursor gas or gas mixture is typically directed downwardly through a gas distribution assembly situated near the top of the chamber. The gas distribution assembly is placed above a substrate that is positioned on a heated pedestal at a small distance such that the gas distribution assembly and the process gases are heated by the heat provided from heating elements disposed within the pedestal.

During a CVD process, the process gases in the chamber may be energized (e.g., excited) into a plasma by applying radio frequency (RF) power to the chamber from one or more RF sources coupled to the chamber, referred to as plasma-enhanced CVD (PECVD). An RF source coupled to the pedestal through a RF matching circuit and a faceplate of the gas distribution assembly grounded to the chamber body facilitate formation of a capacitive plasma coupling. The RF source provides RF energy to the pedestal to facilitate generation of the capacitive coupled plasma, also known as a main plasma, between the pedestal and the faceplate of the gas distribution assembly. However, a parasitic plasma, also known as a secondary plasma, may be generated underneath the pedestal in a lower volume of the vacuum chamber as a byproduct of generating the capacitive coupled plasma and ground path of the faceplate. The parasitic plasma reduces the ion concentration formed in the capacitive coupled plasma, and thus reduces the density of the capacitive coupled plasma which reduces the deposition rate of the film.

Additionally, in conventional designs, only a linear motion has been used to transfer a wafer pedestal between process and transfer positions within a process chamber. However, due to mechanical tolerance issues between hardware components in the process chamber, the surface of the pedestal and faceplate of the showerhead are often non-parallel, which causes process non-uniformity on the surface of a processed substrate. In one example, a deposited film has a thickness non-uniformity that varies edge-to-edge across the substrate. CVD processes each have a different uniformity response to a pedestal's tilt and position relative to one or more of the chamber components, such as the showerhead. To assure optimal process results, each layer requires an independently adjusted or tuned pedestal tilt and position relative to the showerhead to achieve the best process results.

Accordingly, there is a need for a device that allows independent motion between two devices in a process chamber, while preventing a parasitic plasma in unwanted regions of the process chamber.

SUMMARY

One or more embodiments described herein relate to lift assemblies that are able to adjust the relative position of and orientation of a pedestal relative to one or more stationary components within a process chamber. The lift assemblies include hardware components that are useful within a plasma process chamber, such as a chamber used to perform PECVD, etch, or other useful plasma processes on a substrate. One or more embodiments described herein relate to methods for using the lift assemblies. One or more embodiments described herein relate to systems that include the lift assemblies.

In one embodiment, a lift assembly includes a pedestal having a substrate supporting surface and a sidewall that defines an outer dimension of the pedestal; a bottom bowl lift that includes a bottom bowl having a wall having an inner dimension that is larger than the outer dimension of the pedestal; a bottom bowl carrier that is configured to support the bottom bowl; a bottom bowl actuator assembly configured to cause the bottom bowl carrier to translate in the first direction; and a pedestal lift that includes a pedestal carrier coupled to the pedestal; and a plurality of actuators, wherein each of the plurality of actuators is coupled to a separate portion of the pedestal carrier, and the plurality of actuators are configured to cause relative linear and angular motion between the pedestal and the bottom bowl when one or more of the plurality of actuators causes at least a portion of the pedestal carrier to translate in the first direction.

In another embodiment, a method for a lift system includes lowering a bottom bowl lift to an exchange position such that a bottom bowl is in a lowered position proximate a bottom surface of a process chamber, wherein the bottom bowl comprises a wall that has an inner surface that defines inner volume; raising the bottom bowl lift to a process position that is a distance from the bottom surface of the process chamber; orienting the top surface of a pedestal in a first orientation relative to an output surface of a showerhead, wherein the first orientation of the top surface of the pedestal relative to the output surface of the showerhead is not coplanar; and the pedestal is positionable within an inner volume of the bottom bowl; and depositing a first layer of material on a substrate disposed on the top surface of the pedestal while the top surface of the pedestal is oriented in the first orientation, and the bottom bowl lift is in the process position.

In yet another embodiment, a lift system includes a pedestal having a substrate supporting surface and a sidewall that defines an outer dimension of the pedestal; a bottom bowl lift that includes a bottom bowl having a wall having an inner dimension that is larger than the outer dimension of the pedestal; a bottom bowl carrier that is configured to support the bottom bowl; a bottom bowl actuator assembly configured to move the bottom bowl carrier between an exchange position such that bottom bowl is in a lowered position proximate a bottom of a process chamber and a process position such that the bottom bowl is in a raised position relative the bottom of the process chamber; and a pedestal lift including a pedestal carrier that is configured to support the pedestal, wherein the pedestal is positionable within an inner volume of the bottom bowl; an a plurality of actuators, wherein each of the plurality of actuators is coupled to a separate portion of the pedestal carrier, and the plurality of actuators are configured to raise the pedestal proximate an output surface of a showerhead and orient a top surface of the pedestal in a first orientation relative to the output surface of the showerhead, wherein the first orientation of the top surface of the pedestal relative to the output surface of the showerhead is not coplanar.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

Embodiments described herein generally relate to lift devices used to raise and lower a substrate supporting element, or pedestal, used in a substrate process chamber. The lift device is a multicomponent design that allows independent motion between two assemblies within a substrate process chamber. In some embodiments, the lift device includes both a bottom bowl lift assembly and a pedestal lift assembly. The bottom bowl lift supports a bottom bowl and is configured to move the bottom bowl components into a position that reduces the process volume, which provides a shorter and symmetrical path for RF energy to propagate to a ground to reduce generation of a parasitic plasma, increasing the deposition rate, reducing the chance of generating particles, and improving the deposited film uniformity. In some embodiments, the bottom bowl lift is positioned so that it is co-axial with the pedestal lift and the two lifts are attached such that each lift moves independently. The pedestal lift includes multiple actuators that are able to manipulate the orientation of the pedestal relative to the output surface of a showerhead. Additionally, the pedestal lift can move independently to its process position and move in the desired direction without interference with the bottom bowl lift. In some embodiments, the bottom bowl lift has one axis of motion that is aligned co-axially with the pedestal lift that has three axes of motion.

Figure 1:
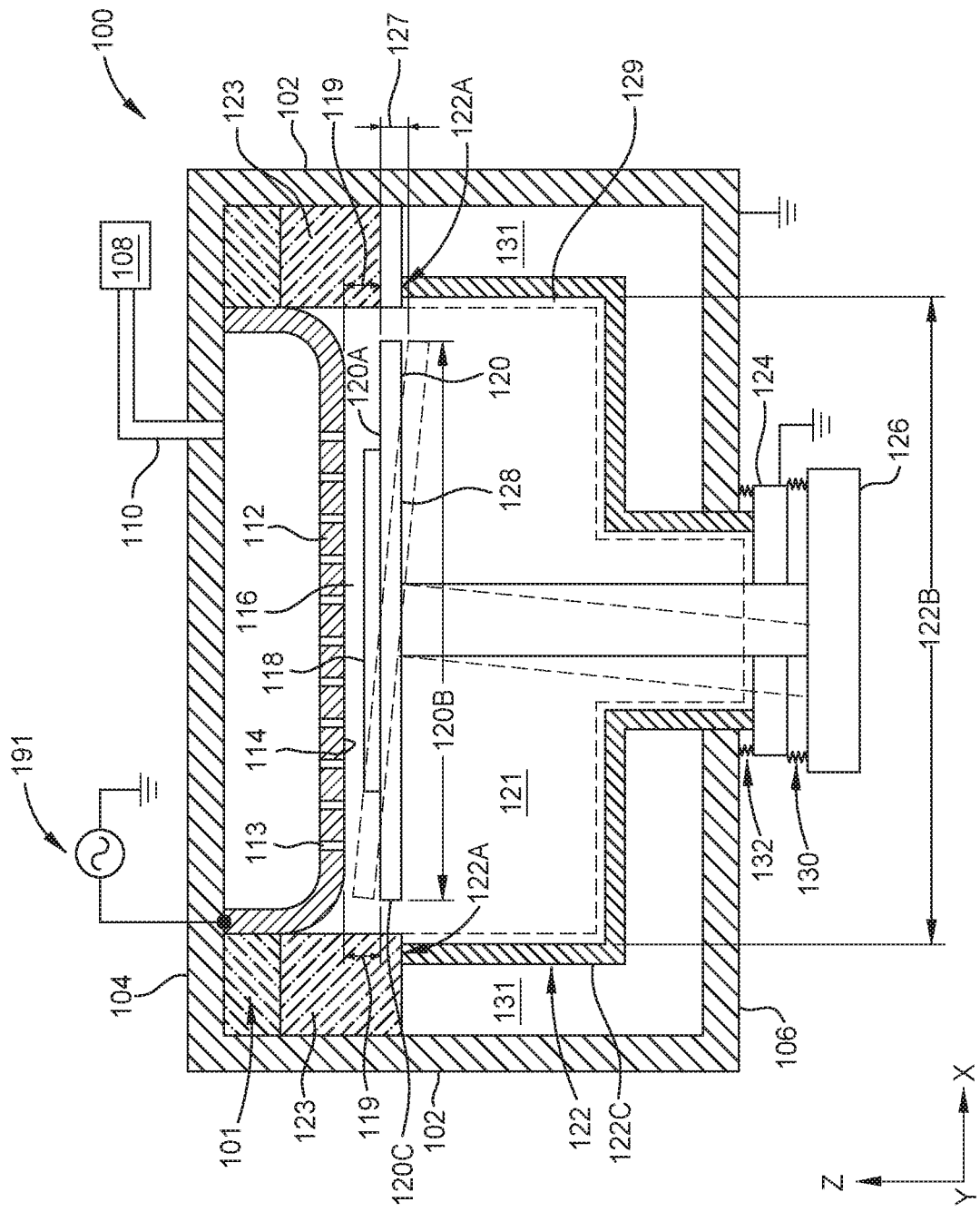
FIG. 1 is a side cross-sectional view of a process chamber according to at least one embodiment described in the present disclosure.

FIG. 1 is a side cross-sectional view of a process chamber 100 according to at least one embodiment described in the present disclosure. The process chamber 100 includes sidewalls 102, a top 104, and a bottom 106. A gas source 108 provides gases through the top 104 of the process chamber 100 via an opening 110. The gases then flow through a plurality of holes 113 to an output surface 114 of a showerhead 112 and into a process region 116. The gases are energized within the process region 116 by applying RF power to the process chamber 100 from one or more RF sources 191. In some embodiments, the delivered RF energy facilitates generation of a capacitive coupled plasma, also known as a main plasma, which act to form or process a semiconductor film disposed on a substrate 118. The substrate 118 is generally located on a top surface 120A of a pedestal 120 during processing. The top surface 120A of the pedestal 120 is located a small distance 119 from the output surface 114 of the showerhead 112. The pedestal 120 is typically an electrostatic chuck, vacuum chuck, or any other similar device that is capable of being heated or cooled to a process temperature, which in some cases can be to temperatures that are greater than about 700 degrees Celsius. The pedestal 120 also has a sidewall 120C that defines an outer dimension 120B of the pedestal 120.

In addition to the main plasma formed in the process region 116, a secondary plasma, also known as a parasitic plasma, may be formed underneath the pedestal 120 in a lower volume of the process chamber 100. This occurs as a byproduct of generating the main plasma and the ground path of the RF current within the lower volume of the process chamber 100. The parasitic plasma reduces the ion concentration formed within the main plasma, and thus reduces the density of the main plasma, which for plasma enhanced deposition processes reduces the deposition rate and reduces film uniformity. To counteract the amount of parasitic plasma formed, a bottom bowl 122 is lifted by a bottom bowl lift 124 into a process position (explained below in FIG. 5B). When the bottom bowl 122 is in the process position, it is typically positioned such that an upper end 122A of the bottom bowl 122 is against a surface of an edge ring 123, or another similar component. The edge ring 123 can be coupled to or positioned adjacent to the showerhead 112. When the bottom bowl 122 is in its process position, the bottom bowl 122 has a wall 122C that includes an inner volume 121 within the process chamber 100. The inner volume 121 has a reduced surface area, represented by reference number 129, relative to the total volume of the process chamber 100. The reduced surface area 129 is defined by the inner surface of the wall 122C of the bottom bowl 122. The chamber volume of the process chamber 100 outside the inner volume 121 is represented by reference number 131. The reduced surface area 129 enables a shorter and more controlled ground path so that the parasitic plasma is not generated underneath the pedestal 120 in the inner volume 121. The bottom bowl 122 is an axially symmetric component (e.g., about the Z-axis in FIG. 1), which as seen in FIGS. 1, 2A and 5A-5B, is sized such that at least the upper end 122A and the wall 122C forming the inner volume 121 of the bottom bowl 122 is larger than the outer dimension 120B (e.g., diameter) of the pedestal 120. In other words, the size of the inner volume 121, represented by reference number 122B, is larger than the outer dimension 120B of the pedestal 120. This configuration allows the bottom bowl 122 to move independently without inference from the pedestal 120. The bottom bowl 122 is formed from a conductive material that generally does not react with the process gases used during processing in the process chamber 100. In one example, the bottom bowl 122 is formed from stainless steel, metal coated or uncoated aluminum alloy, a doped silicon carbide, or other useful material.

Along with the bottom bowl lift 124 lifting the bottom bowl 122, the pedestal 120 is lifted by a pedestal lift 126 to manipulate the orientation of the top surface 120A of the pedestal 120 relative to the output surface 114 of the showerhead 112. The pedestal lift 126 and the bottom bowl lift 124 are configured to move independently such that they do not interfere with each other during use. In some embodiments, the pedestal lift 126 can orient the pedestal 120 such that it is tilted relative to a horizontal plane (i.e., X-Y plane) and/or the output surface 114 of the showerhead 112, for example as shown in position 128 (phantom lines). This is beneficial to counteract mechanical tolerance issues created between hardware components in processing chambers. Often, the top surface 120A of the pedestal 120 and output surface 114 of the showerhead 112 are non-parallel, which causes process non-uniformity on the surface of a substrate 118 disposed on the top surface 120A of the pedestal lift 126. However, the pedestal lift 126 as described herein acts to orient the top surface 120A of the pedestal 120 such that can remain in a parallel relationship with the output surface 114 of the showerhead 112 to assure optimal process results. For example, the pedestal 120 may need to be tilted to the position 128 for optimal results. The tilt amplitude 127 can be shifted up or down by about 0.05 inches to about 0.1 inches in these embodiments, however other tilt amplitudes are also possible.

The bottom bowl lift 124 and the pedestal lift 126 are attached together via a bellows 130 such that the pedestal lift 126 components can move independently without inference with the bottom bowl lift 124 components. The bellows 130 and a cooling hub 208 (FIG. 2) provide a seal between the pedestal lift 126/bottom bowl lift 124. The lower end of the bottom bowl 122 includes a bellows 132 that has an upper end that is bolted and sealed to a portion of the bottom 106 of the process chamber 100 to form a chamber seal that allows the process region 116 of process chamber 100 to be pumped to a vacuum state by a chamber pump (not shown). The bellows 130 and bellows 132 both allow the process region 116 of the process chamber 100 to be maintained at a desired pressure, such as a vacuum pressure. The bellows 130 and bellows 132 are generally formed from a metal material, such as a stainless steel, Inconel alloy, or other suitable fatigue resistant and conductive material.

Figure 2:
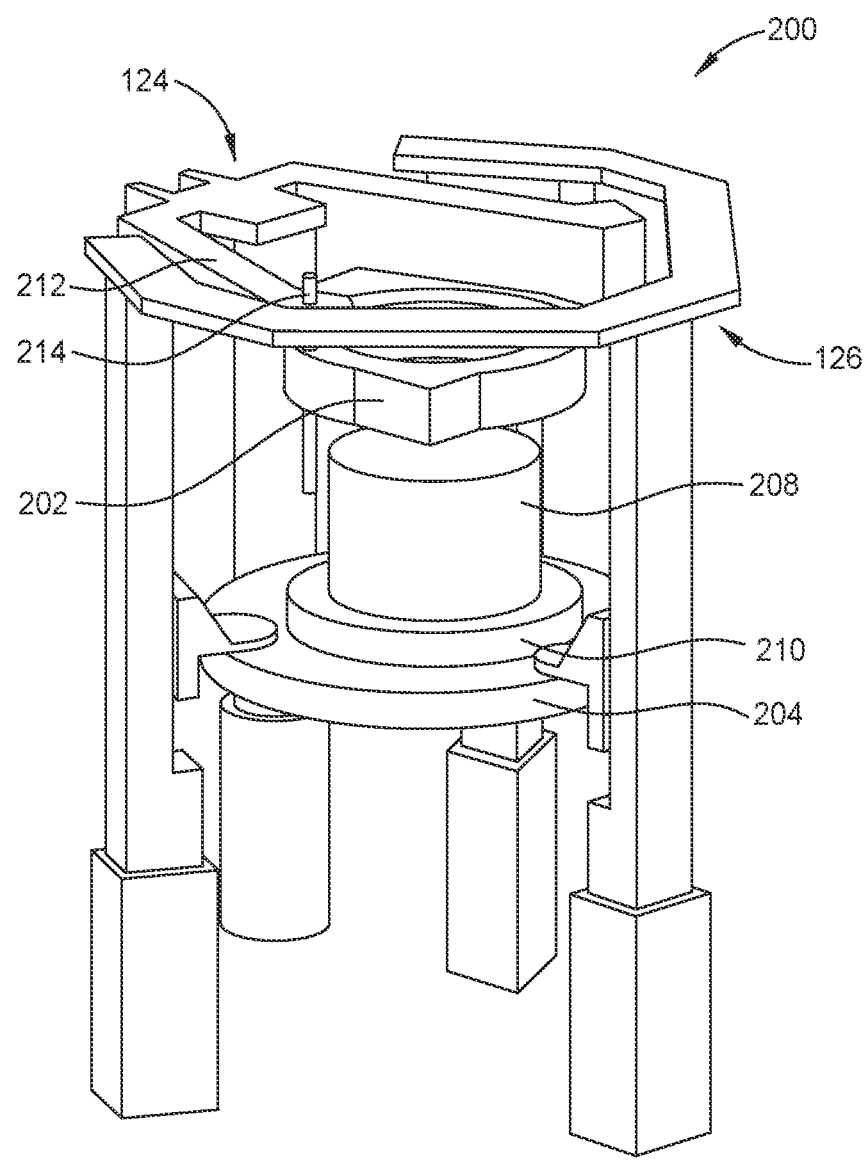
FIG. 2 is a perspective view of a lift system according to at least one embodiment described in the present disclosure.
Figure 3:
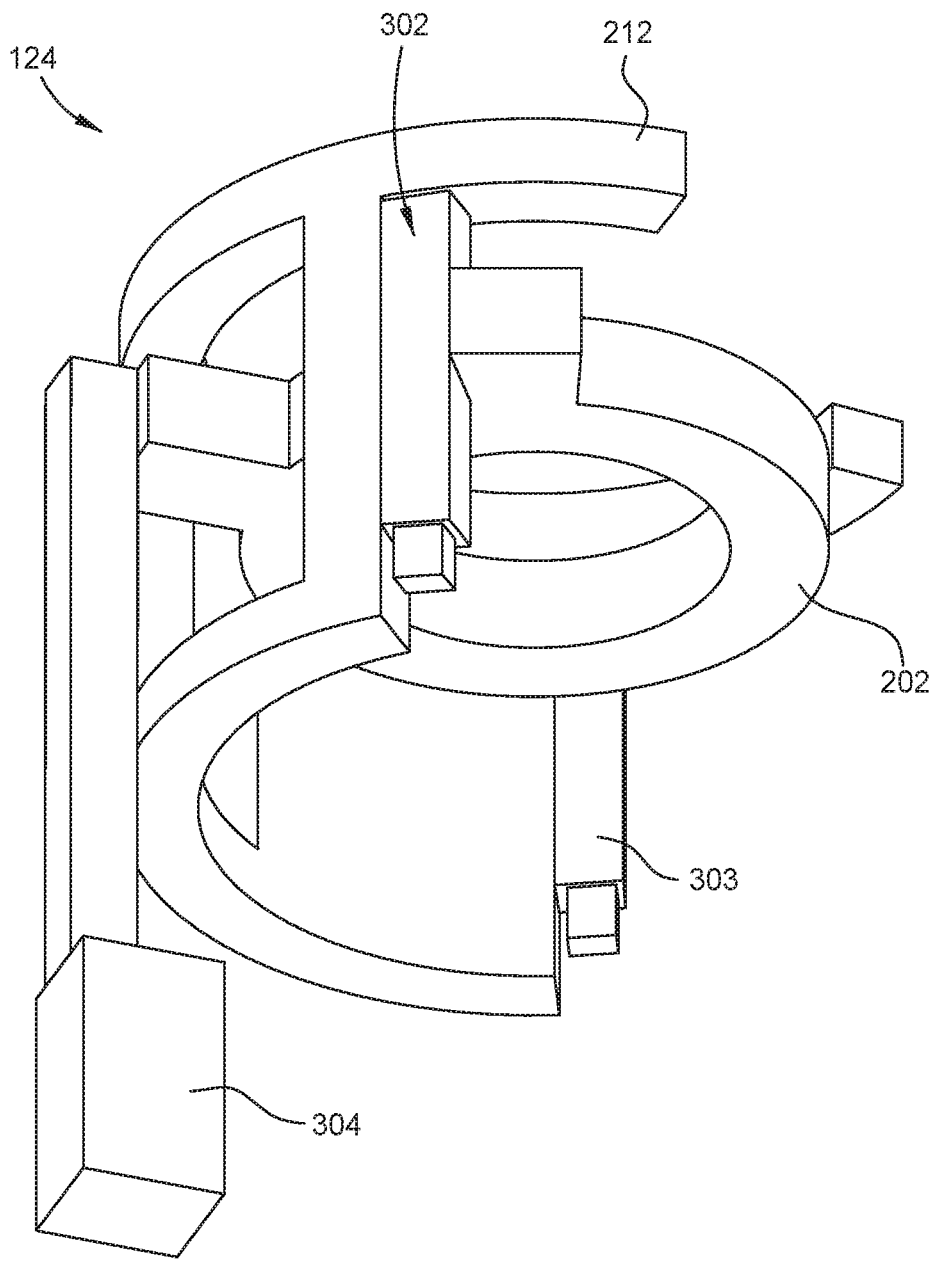
FIG. 3 is a perspective view of the bottom bowl lift in FIG. 1.
Figure 4:
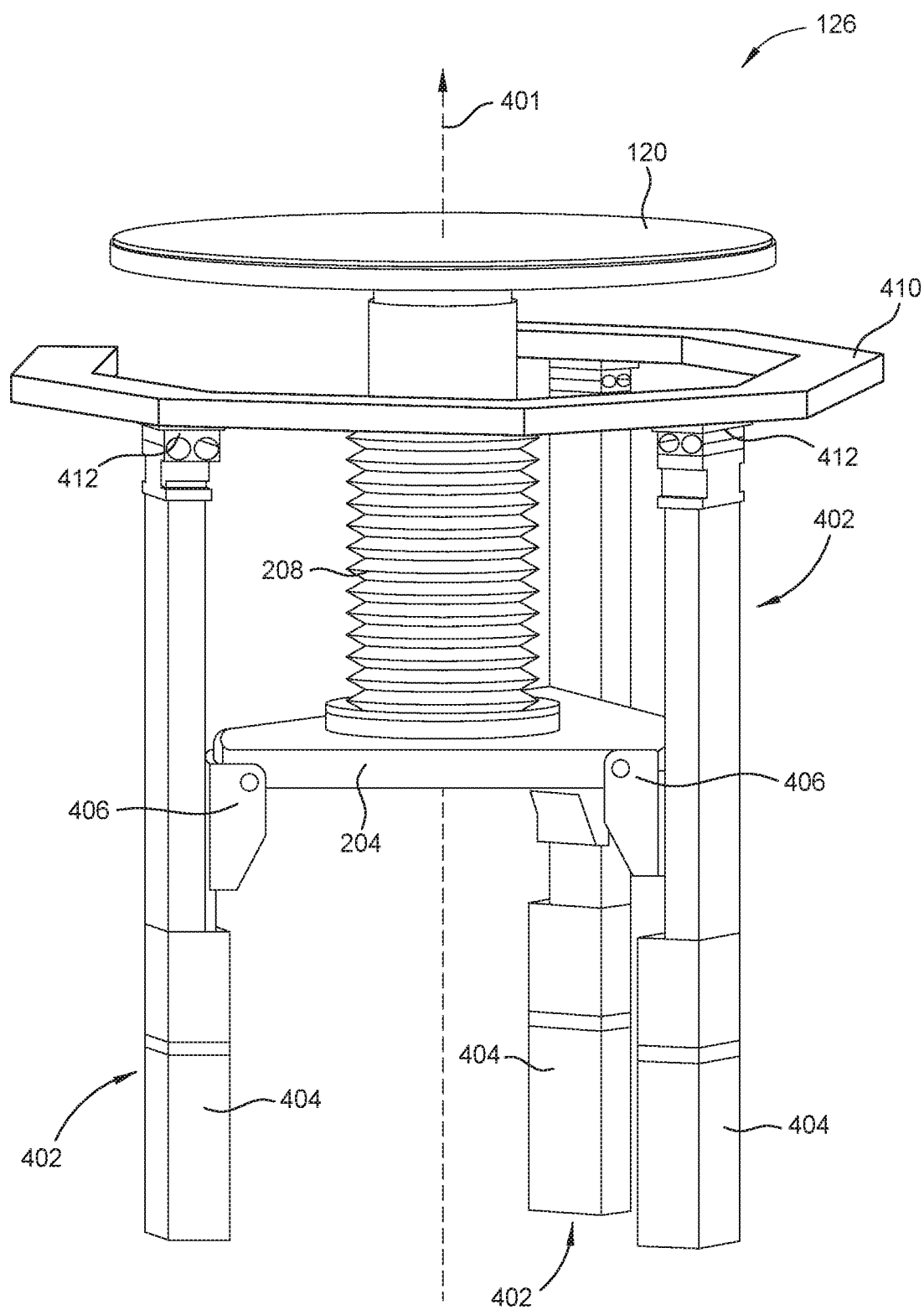
FIG. 4 is a perspective view of the pedestal lift in FIG. 1.

FIG. 2 is a perspective view of a lift system 200 according to at least one embodiment described in the present disclosure. FIG. 3 is a perspective view of the bottom bowl lift 124 only, and FIG. 4 is a perspective view of the pedestal lift 126 only. As shown in FIG. 2, the lift system 200 includes the bottom bowl lift 124 and the pedestal lift 126. The bottom bowl lift 124 comprises a bottom bowl carrier 202 that is coupled to and supports the bottom bowl 122. The bottom bowl 122 is configured to move within the process chamber 100. The pedestal lift 126 comprises a pedestal carrier 204 that is coupled to and supports the pedestal 120. The pedestal 120 can be raised and lowered, and also tilted in any direction (pitch and roll) which will be described further below. The bottom bowl carrier 202 and the pedestal carrier 204 are attached together via the bellows 130 (FIG. 1) such that the pedestal lift 126 components can move independently without inference with the bottom bowl lift 124 components. As stated above, the bellows 130 and the cooling hub 208 provide a seal between the pedestal lift 126 and the bottom bowl lift 124. Water supplied by the cooling hub 208 flows through the bottom bowl carrier 202 to provide cooling during processing. The bottom bowl carrier 202 and the pedestal carrier 204 are coaxially supported via a two axis positioner 210. The bottom bowl lift 124 comprises a backbone structure 212 (FIGS. 2 and 3) that is attached to the bottom bowl carrier 202 using kinematic mounts 214 that provides angular adjustment of the bottom bowl 122 relative to a reference surface on the bottom 106 of the process chamber 100.

Referring to FIG. 3, the bottom bowl lift 124 includes an actuator assembly 302 and one or more guides 303. The actuator assembly 302 acts to move the bottom bowl carrier 202 vertically up and down (i.e., Z-direction) between an exchange position and a process position (discussed below in FIGS. 5A-5B). The actuator assembly 302 is attached to a backbone structure 212 and the bottom bowl carrier 202. As discussed above, the backbone structure 212 provides angular adjustment of the bottom bowl lift 124 assembly so that the angular alignment of the bottom bowl 122, which is supported by the bottom bowl carrier 202, can be independently adjusted relative to components within the process chamber. The actuator assembly 302 can include a linear actuator, such as a linear motor, air cylinder, or ball screw actuator. The actuator assembly 302 can include and be driven by a servo motor system 304. The servo motor system 304 can drive the actuator assembly 302 by use of an absolute encoder, servo motor, and brake. The one or more guides 303 may be slides and may each include a linear motion guide to allow relative linear motion between the backbone structure 212 and the bottom bowl carrier 202. This guides the bottom bowl carrier 202 between its process and transfer positions.

Referring to FIG. 4, the pedestal lift 126 includes the pedestal 120 for supporting a substrate 118 (FIG. 1). As discussed above, the pedestal 120 is supported by the pedestal carrier 204. The cooling hub 208 provides water flow to keep the pedestal carrier 204 (and the bottom bowl 122) cool during processing, which can in some cases be over 700 degrees Celsius. The pedestal lift 126 is configured to manipulate the position and/or orientation of the pedestal 120 relative to the output surface 114 of the showerhead 112 (FIG. 1). In this embodiment, the pedestal lift 126 utilizes three points of contact to the pedestal carrier 204 to establish a leveling plane for the pedestal 120 relative to the output surface 114 of the showerhead 112.

The pedestal carrier 204 is generally adapted to be moved vertically in a direction that is parallel to a center axis 401 by use of a plurality of actuators 402. In these embodiments, there are three actuators 402, but more or less than three actuators can be used. Like the actuator assembly 302 discussed above, the actuators 402 can each include a linear actuator, such as a linear motor, air cylinder, or ball screw actuator. The top ends of the actuators 402 are attached to a base assembly 410 that is attached to a reference surface on the bottom 106 of the process chamber 100. Spherical joint assemblies 406 couple the actuators 402 to the pedestal carrier 204 and facilitate movement between the pedestal carrier 204 and actuators 402. In some embodiments, the spherical joint assemblies 406 allow three degrees of freedom (pitch, yaw, and roll) about the attachment point formed on the pedestal carrier 204. The actuators 402 are configured to cause relative linear and angular motion between the pedestal 120 and the bottom bowl 122. Flexure hinges 412 are attached to the base assembly 410 at one end and are attached to the actuators 402 at the other end. In this embodiment, the combination of three actuators 402 configured in opposing support locations fully constrain the pedestal carrier 204 motion while giving the pedestal lift 126 the flexibility to move in four degrees of freedom (e.g., elevation (Z-direction), pitch, yaw, & roll). The flexure hinges 412 flex due to the moment created by the differing motion of the actuators 402 that causes the pedestal carrier 204 to pivot in a direction relative to the center axis 401. Each of the flexure hinges 412 provide an extremely stiff mounting point for each actuator 402 to resist the load on the assembly while allowing a small amount (<0.5 degrees) of rotation to occur at each actuator 402. The flexure hinges 412 also act as a radial preload for the spherical joint assemblies 406 in the assembly.

Servo motors 404 drive the actuators 402, and thus drive the spherical joint assemblies 406 and the pedestal carrier 204 in a vertical direction (Z-direction) along the actuators 402. In operation, the system controller (not shown) drives the servo motors 404 that continuously move the actuators 402 using dynamic motion profiles to manipulate the position and/or orientation of the pedestal 120. Such operation can allow the position and/or orientation of the pedestal 120 relative to the output surface 114 of the showerhead 112 to continually vary as the pedestal 120 pivots and/or moves along the center axis 401. By continuously driving the servo motors 404, the orientation of the pedestal 120 will continuously move in one or more directions relative to a stationary reference frame (e.g., X-Y-Z reference frame). It has been found that maintaining a continuous tilt relative to the output surface 114 of the showerhead 112 and causing the pedestal 120 to precess about the center axis 401, using the plurality of actuators 402, for a period of time results in improved process uniformity for the deposition of certain CVD deposited films. However, as discussed above, there is still a need to reduce and/or prevent the generation of a parasitic plasma within the region below the pedestal 120, which is resolved by use of the bottom bowl lift 124 that controls the position of the bottom bowl 122. As discussed above, due to the configuration of the pedestal lift 126 and bottom bowl lift 124, the two assemblies are each able to be separately adjusted and controlled so that the orientation and position of their respective hardware components move independently. The various embodiments described herein thus allow the components in each of these assemblies to be properly and separately aligned to one or more different components within the process chamber to provide a desirably formed or processed film on a substrate, and also prevent the generation of the parasitic plasma that can generate particles and create undesirable processing results (e.g., low deposition rate, poor uniformity, etc.).

Figure 5A:
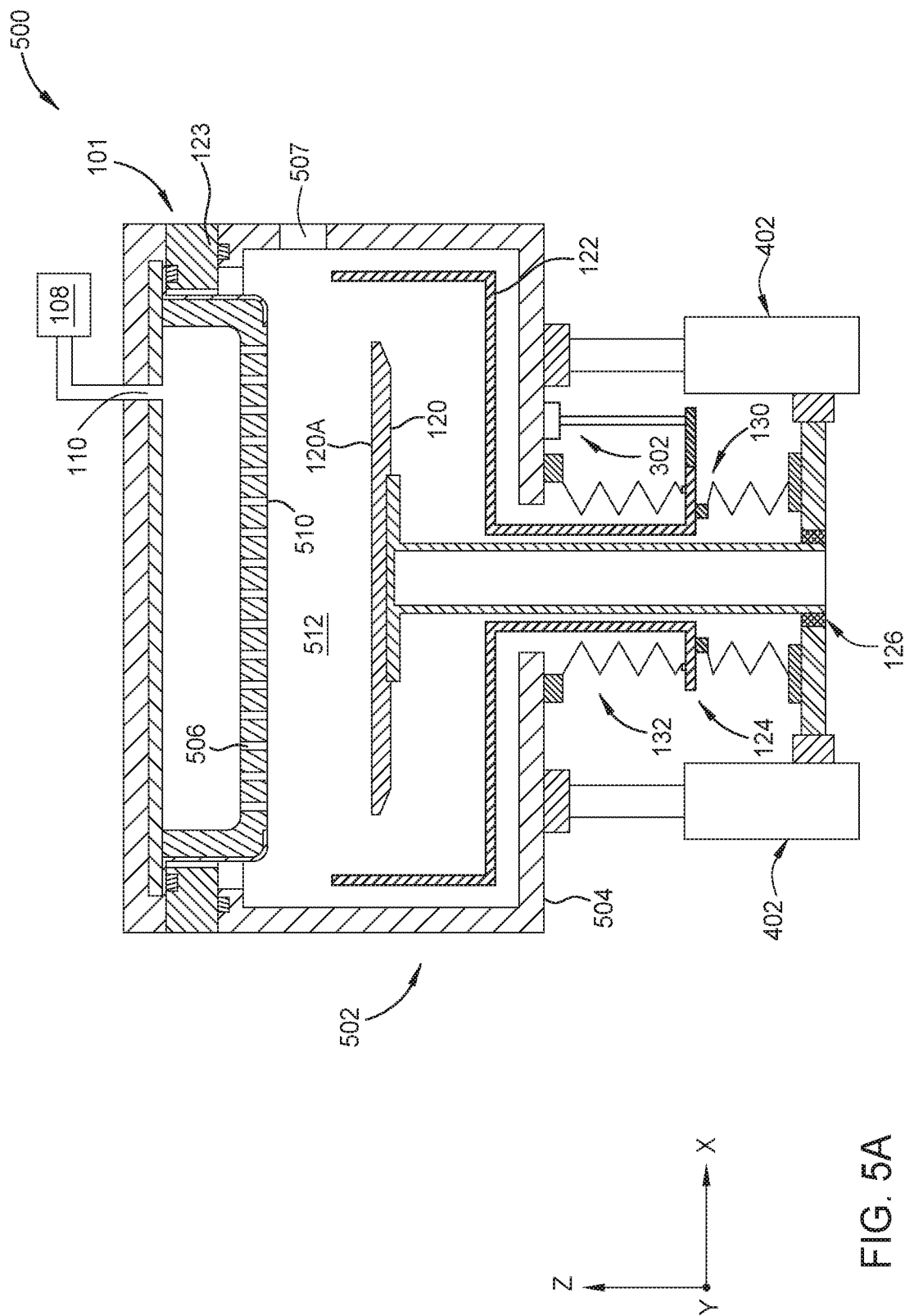
FIG. 5A is a side view of a lift system according to at least one embodiment described in the present disclosure.
Figure 5B:
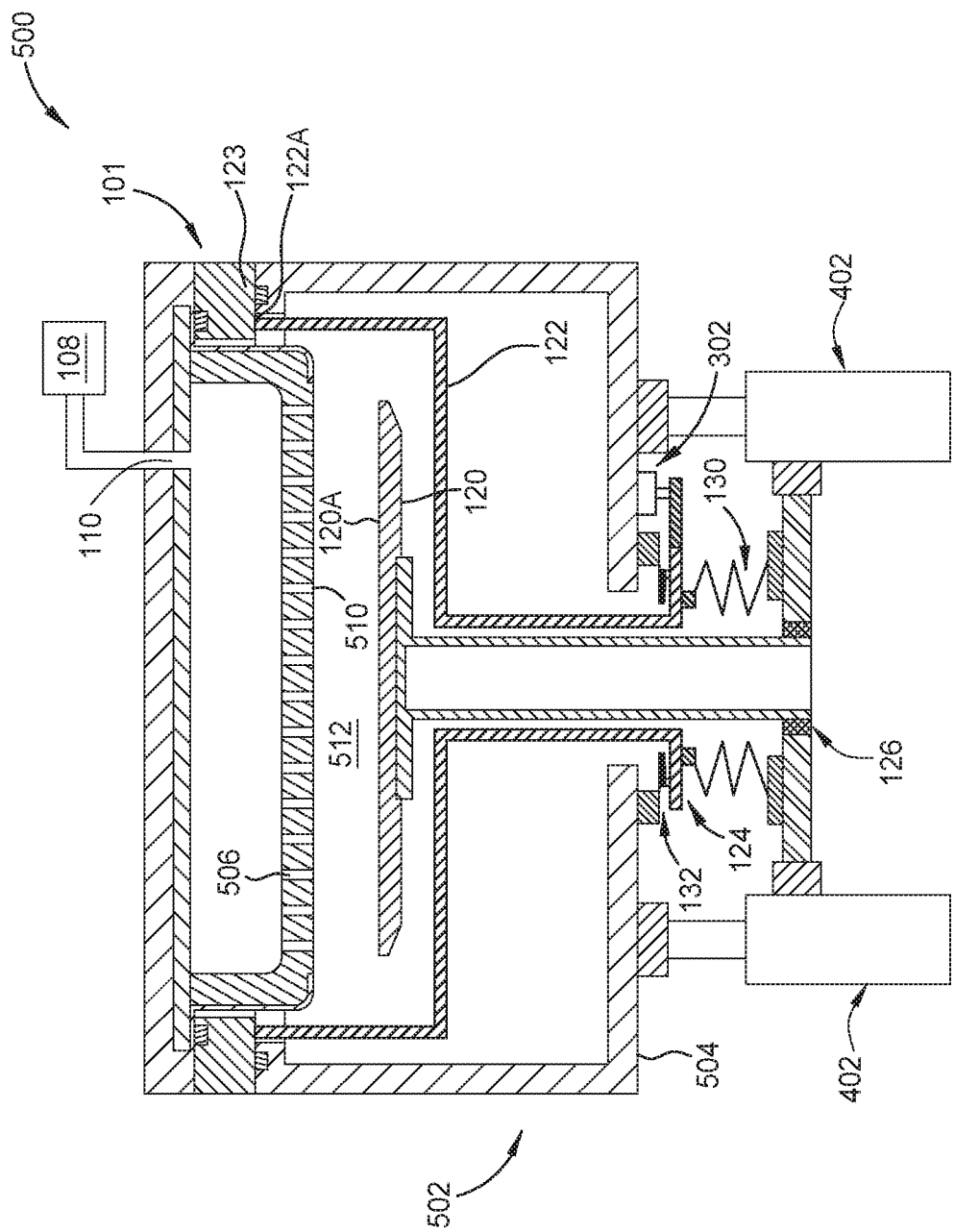
FIG. 5B is a side view of a lift system according to at least one embodiment described in the present disclosure.

FIG. 5A shows a lift system 500 in an exchange position and FIG. 5B shows the lift system 500 in a process position. When the lift system 500 is in the exchange position, the bottom bowl 122 is lowered by the bottom bowl lift 124 downward near a bottom 504 of a process chamber 502. Additionally, when the lift system 500 is in the exchange position, the pedestal 120 is lowered by the pedestal lift 126 in a position such that the pedestal 120 can receive the substrate 118 through a slit valve 507 formed through the process chamber 502. The slit valve 507 allows the substrate 118 (FIG. 1) to be placed on the top surface 120A of the pedestal 120 such that semiconductor films can be fabricated on the substrate 118 during processing.

When the lift system 500 is in the process position, the bottom bowl 122 is raised by the bottom bowl lift 124 such that it forms an inner volume 121 (FIG. 1) within the process chamber 502 by causing the upper end 122A (FIGS. 1 and 5B) of the bottom bowl 122 to contact a component within the upper region 101 of the process chamber, such as the edge ring 123. This reduces the process volume beneath the pedestal 120, and also provides a shorter and symmetrical path for RF energy to propagate to a ground to reduce generation of a parasitic plasma, increasing the deposition rate, reducing the chance of generating particles, and improving the deposited film uniformity. Additionally, the pedestal lift 126 lifts the pedestal 120 such that the top surface 120A of the pedestal 120 is proximate a showerhead 506 located within the upper region 101 of the process chamber 502. As discussed above, the pedestal lift 126 is also configured to raise the pedestal 120 proximate an output surface 510 of the showerhead 506. The top surface 120A of the pedestal 120 is orientated such that it is not coplanar relative to the output surface 510 of the showerhead 506. Furthermore, the top surface 120A of the pedestal 120 can be tilted without the need to adjust the position of the bottom bowl 122. As discussed above, the pedestal lift 126 is configured such that the pedestal 120 moves independently without inference from the bottom bowl 122, as the bottom bowl 122 is lifted to a separate area within the process chamber 502 away from the pedestal 120.

As discussed above in FIG. 1, gases are provided through the showerhead 506 within the upper region 101 of the process chamber 502. The gases are then distributed through the showerhead 506 to the output surface 510 and then to a process region 512 where semiconductor films are formed on the substrate 118 located on the top surface 120A of the pedestal 120. A first layer of material can be deposited on the substrate 118 when the top surface 120A of the pedestal 120 is not coplanar relative to the output surface 510 of the showerhead 506. Any number of layers of material can be distributed when the pedestal 120 is in this orientation, or the pedestal 120 can be positioned in a different orientation relative to the output surface 510 of the showerhead 506 before another layer of material is applied on the substrate 118. The advantage of tilting the pedestal 120 is to improve uniformity of the process performed in the process chamber, such as film deposition. The location of the pedestal 120 can be fine-tuned for each process. The addition of the bottom bowl 122 and bottom bowl lift 124 allows the benefits of the ability to separately tilt the pedestal 120 to be realized while also allowing the smaller inner volume 121 within the process chamber 502 to be formed which provides additional substrate processing benefits, as described above.

While the foregoing is directed to embodiments of the present disclosure, other and further embodiments of the disclosure may be devised without departing from the basic scope thereof, and the scope thereof is determined by the claims that follow.

We claim:

1. A lift assembly, comprising:
   a pedestal having a substrate supporting surface and a sidewall that defines an outer dimension of the pedestal;
   a bottom bowl lift comprising:
   a bottom bowl comprising a wall having an inner dimension that is larger than the outer dimension of the pedestal;

a bottom bowl carrier that is configured to support the bottom bowl;

a backbone structure attached to the bottom bowl carrier and having adjustable mounts configured to provide angular adjustment of the backbone structure and the bottom bowl; and a bottom bowl actuator assembly configured to cause the bottom bowl carrier to translate in a first direction; and a pedestal lift comprising:

a pedestal carrier coupled to the pedestal; and a plurality of actuators, wherein each of the plurality of actuators is coupled to a separate portion of the pedestal carrier, and the plurality of actuators is configured to cause relative linear and angular motion between the pedestal and the bottom bowl when one or more of the plurality of actuators causes at least a portion of the pedestal carrier to translate in the first direction.

2. The lift assembly of claim 1, wherein the bottom bowl carrier and the pedestal carrier are attached together via a bellows, the bellows forming a seal between the bottom bowl lift and the pedestal lift.

3. The lift assembly of claim 1, wherein the bottom bowl actuator assembly further comprises one or more guides and a bottom bowl actuator, wherein the one or more guides are coupled to the backbone structure and the bottom bowl carrier, and the one or more guides are configured to allow relative linear motion between the backbone structure and the bottom bowl carrier in the first direction when the bottom bowl actuator causes the bottom bowl carrier to translate in the first direction.

4. The lift assembly of claim 1, further comprising spherical joint assemblies, wherein each of the spherical joint assemblies couple one of the plurality of actuators to the pedestal carrier.

5. The lift assembly of claim 4, wherein the spherical joint assemblies allow three degrees of freedom (pitch, yaw, and roll) about an attachment point.

6. The lift assembly of claim 1, further comprising flexure hinges with a first end and a second end, wherein each of the flexure hinges is attached to a base assembly at the first end and is attached to one of the plurality of actuators at the second end.

7. The lift assembly of claim 1, further comprising a cooling hub attached to the bottom bowl carrier and the pedestal carrier.

8. The lift assembly of claim 1, wherein the plurality of actuators comprises three actuators.

9. A lift system, comprising:

a pedestal having a substrate supporting surface and a sidewall that defines an outer dimension of the pedestal;

a bottom bowl lift comprising:

a bottom bowl comprising a wall having an inner dimension that is larger than the outer dimension of the pedestal;

a bottom bowl carrier that is configured to support the bottom bowl;

a backbone structure attached to the bottom bowl carrier and having adjustable mounts configured to provide angular adjustment of the backbone structure and the bottom bowl relative to a bottom of the process chamber; and a bottom bowl actuator assembly configured to move the bottom bowl carrier between an exchange position such that bottom bowl is in a lowered position proximate a bottom of a process chamber and a process position such that the bottom bowl is in a raised position relative the bottom of the process chamber; and a pedestal lift comprising:

a pedestal carrier that is configured to support the pedestal, wherein the pedestal is positionable within an inner volume of the bottom bowl; and a plurality of actuators, wherein each of the plurality of actuators is coupled to a separate portion of the pedestal carrier, and the plurality of actuators is configured to raise the pedestal proximate an output surface of a showerhead and orient a top surface of the pedestal in a first orientation relative to the output surface of the showerhead, wherein the first orientation of the top surface of the pedestal relative to the output surface of the showerhead is not coplanar.

10. The lift system of claim 9, wherein a lower end of the bottom bowl further comprises a bellows having a first end and a second end, the first end of the bellows coupled to the wall and the second end of the bellows sealed to a portion of the bottom of the process chamber.

11. The lift system of claim 9, wherein the bottom bowl actuator and each of the plurality of actuators are linear ball screw actuators.

12. The lift system of claim 11, wherein each of the linear ball screw actuators is driven by a servo motor.

13. The lift system of claim 9, further comprising spherical joint assemblies, wherein each of the spherical joint assemblies couple one of the plurality of actuators to the pedestal carrier.

14. The lift system of claim 13, wherein the spherical joint assemblies allow three degrees of freedom (pitch, yaw, and roll) about an attachment point.

15. The lift system of claim 9, further comprising flexure hinges with a first end and a second end, wherein each of the flexure hinges is attached to a base assembly at the first end and is attached to one of the plurality of actuators at the second end.

16. The lift system of claim 9, further comprising a cooling hub attached to the bottom bowl carrier and the pedestal carrier.

17. The lift system of claim 9, wherein the plurality of actuators comprises three actuators.

* * * * *